US009576785B2

(12) United States Patent
Blondia

(10) Patent No.: US 9,576,785 B2
(45) Date of Patent: Feb. 21, 2017

(54) ELECTRODELESS SINGLE CW LASER DRIVEN XENON LAMP

(71) Applicant: Excelitas Technologies Corp., Waltham, MA (US)

(72) Inventor: Rudi Blondia, Fremont, CA (US)

(73) Assignee: Excelitas Technologies Corp., Waltham, MA (US)

( * ) Notice: Subject to any disclaimer, the term of this patent is extended or adjusted under 35 U.S.C. 154(b) by 0 days.

(21) Appl. No.: 14/712,304

(22) Filed: May 14, 2015

(65) Prior Publication Data

US 2016/0336167 A1   Nov. 17, 2016

(51) Int. Cl.
H01J 7/24 (2006.01)
H01J 61/54 (2006.01)
(Continued)

(52) U.S. Cl.
CPC ............ *H01J 61/54* (2013.01); *H01J 61/025* (2013.01); *H01J 65/04* (2013.01); *G03F 7/7005* (2013.01);
(Continued)

(58) Field of Classification Search
CPC ............ G03F 7/70008; G03F 7/70016; G03F 7/70025; G03F 7/70033; G03F 7/7005
USPC ... 250/423 R, 423 P, 424, 426, 494.1, 493.1, 250/504 R, 504 H; 313/231.31, 231.41, 313/231.61, 231.71, 631, 632, 633;
(Continued)

(56) References Cited

U.S. PATENT DOCUMENTS

| 3,502,929 A | 3/1970 | Richter |
| 3,515,491 A | 6/1970 | Emary |

(Continued)

FOREIGN PATENT DOCUMENTS

| DE | 243629 A3 | 3/1987 |
| DE | 10 2011 113681 A1 | 3/2013 |

(Continued)

OTHER PUBLICATIONS

I.M. Beterov et al., "Resonance radiation plasma (photoresonance plasma)", Sov. Phys. Usp. 31 (6), 535 (1988).

(Continued)

*Primary Examiner* — Thai Pham
*Assistant Examiner* — Borna Alaeddini
(74) *Attorney, Agent, or Firm* — Peter A. Nieves; Sheehan Phinney Bass & Green PA

(57) ABSTRACT

An ignition facilitated electrodeless sealed high intensity illumination device is disclosed. The device is configured to receive a laser beam from a continuous wave (CW) laser light source. A sealed chamber is configured to contain an ionizable medium. The chamber has an ingress window disposed within a wall of a chamber interior surface configured to admit the laser beam into the chamber, a plasma sustaining region, and a high intensity light egress window configured to emit high intensity light from the chamber. A path of the CW laser beam from the laser light source through the ingress window to a focal region within the chamber is direct. The ingress window is configured to focus the laser beam to within a predetermined volume, and the plasma is configured to be ignited by the CW laser beam, optionally by heating of a non-electrode ignition agent located entirely within the chamber.

22 Claims, 7 Drawing Sheets

(51) Int. Cl.
*H01J 65/04* (2006.01)
*H01J 61/02* (2006.01)
*G03F 7/20* (2006.01)

(52) U.S. Cl.
CPC ...... *G03F 7/70008* (2013.01); *G03F 7/70016* (2013.01); *G03F 7/70025* (2013.01); *G03F 7/70033* (2013.01)

(58) Field of Classification Search
USPC ...... 315/111.21, 111.71, 111.91; 252/301.16, 252/301.36, 301.4 F; 385/31, 33, 38; 438/104, 156, 301, 513
See application file for complete search history.

(56) References Cited

U.S. PATENT DOCUMENTS

| | | |
|---|---|---|
| 3,619,588 A | 11/1971 | Chambers |
| 3,808,496 A | 4/1974 | McRae et al. |
| 3,826,996 A | 7/1974 | Jaegle |
| 3,900,803 A | 8/1975 | Silfvast et al. |
| 4,088,966 A | 5/1978 | Samis |
| 4,152,625 A | 5/1979 | Conrad |
| 4,420,690 A | 12/1983 | Kuehl |
| 4,498,029 A | 2/1985 | Yoshizawa |
| 4,622,464 A | 11/1986 | Sukigara et al. |
| 4,646,215 A | 2/1987 | Levin |
| RE32,626 E | 3/1988 | Yoshizawa |
| 4,738,748 A | 4/1988 | Kisa |
| 4,780,608 A | 10/1988 | Cross et al. |
| 4,789,788 A | 12/1988 | Cox |
| 4,866,517 A | 9/1989 | Mochizuki et al. |
| 4,901,330 A | 2/1990 | Wolfram |
| 5,432,398 A | 7/1995 | Kogelschatz |
| 5,747,813 A | 5/1998 | Norton et al. |
| 5,905,268 A | 5/1999 | Garcia et al. |
| 5,940,182 A | 8/1999 | Lepper, Jr. et al. |
| 6,184,517 B1 | 2/2001 | Sawada |
| 6,285,743 B1 | 9/2001 | Kondo et al. |
| 6,288,780 B1 | 9/2001 | Fairley et al. |
| 6,324,255 B1 | 11/2001 | Kondo et al. |
| 6,356,700 B1* | 3/2002 | Strobl ............... G02B 6/0006 359/859 |
| 6,414,436 B1 | 7/2002 | Eastlund |
| 6,417,625 B1 | 7/2002 | Brooks et al. |
| 6,541,924 B1 | 4/2003 | Kane et al. |
| 6,679,276 B1 | 1/2004 | Brown et al. |
| 6,737,809 B2 | 5/2004 | Espiau et al. |
| 6,762,849 B1 | 7/2004 | Rulkens |
| 6,788,404 B2 | 9/2004 | Lange |
| 6,956,329 B2 | 10/2005 | Brooks et al. |
| 6,960,872 B2 | 11/2005 | Beeson |
| 6,972,421 B2 | 12/2005 | Melnychuk |
| 7,050,149 B2 | 5/2006 | Owa et al. |
| 7,294,839 B2 | 11/2007 | Rich et al. |
| 7,295,739 B2 | 11/2007 | Solarz |
| 7,307,375 B2 | 12/2007 | Smith |
| 7,390,116 B2 | 6/2008 | Jain |
| 7,427,167 B2 | 9/2008 | Holder et al. |
| 7,429,818 B2 | 9/2008 | Chang et al. |
| 7,435,982 B2 | 10/2008 | Smith |
| 7,439,530 B2 | 10/2008 | Ershov |
| 7,652,430 B1 | 1/2010 | Delgado |
| 7,679,276 B2 | 3/2010 | Blondia |
| 7,744,241 B2 | 6/2010 | Xu |
| 7,786,455 B2 | 8/2010 | Smith |
| 7,989,786 B2 | 8/2011 | Smith |
| 8,192,053 B2 | 6/2012 | Owen et al. |
| 8,242,671 B2 | 8/2012 | Blondia |
| 8,242,695 B2 | 8/2012 | Sumitomo |
| 8,253,926 B2 | 8/2012 | Sumitomo et al. |
| 8,288,947 B2 | 10/2012 | Yukota et al. |
| 8,309,943 B2 | 11/2012 | Smith |
| 8,525,138 B2 | 9/2013 | Smith |
| 8,969,841 B2 | 3/2015 | Smith |
| 9,048,000 B2 | 6/2015 | Smith |
| 9,185,786 B2 | 11/2015 | Smith |
| 2001/0016430 A1 | 8/2001 | Nakano |
| 2001/0035720 A1 | 11/2001 | Guthrie et al. |
| 2002/0017399 A1 | 2/2002 | Chang |
| 2002/0021508 A1 | 2/2002 | Ishihara |
| 2002/0044629 A1 | 4/2002 | Hertz |
| 2002/0080834 A1 | 6/2002 | Kusunose |
| 2003/0052609 A1 | 3/2003 | Eastlund |
| 2003/0068012 A1 | 4/2003 | Ahmad |
| 2003/0147499 A1 | 8/2003 | Kondo |
| 2003/0168982 A1 | 9/2003 | Kim |
| 2003/0231496 A1 | 12/2003 | Sato |
| 2004/0016894 A1 | 1/2004 | Wester |
| 2004/0026512 A1 | 2/2004 | Otsubo |
| 2004/0129896 A1 | 7/2004 | Schmidt |
| 2004/0183031 A1 | 9/2004 | Silverman et al. |
| 2004/0183038 A1 | 9/2004 | Hiramoto et al. |
| 2004/0238762 A1 | 12/2004 | Mizoguchi et al. |
| 2004/0264512 A1 | 12/2004 | Hartlove et al. |
| 2005/0167618 A1 | 8/2005 | Hoshino et al. |
| 2005/0205811 A1 | 9/2005 | Partlo et al. |
| 2005/0207454 A1 | 9/2005 | Starodoumov et al. |
| 2005/0225739 A1 | 10/2005 | Hiura |
| 2005/0243390 A1 | 11/2005 | Tejnil |
| 2006/0039435 A1 | 2/2006 | Cheymol |
| 2006/0097203 A1 | 5/2006 | Bykanov et al. |
| 2006/0109455 A1 | 5/2006 | Haverlag |
| 2006/0131515 A1 | 6/2006 | Partlo |
| 2006/0152128 A1 | 7/2006 | Manning |
| 2006/0192152 A1 | 8/2006 | Ershov |
| 2006/0219957 A1 | 10/2006 | Ershov |
| 2007/0228288 A1 | 10/2007 | Smith |
| 2007/0228300 A1 | 10/2007 | Smith |
| 2007/0285921 A1 | 12/2007 | Zulim et al. |
| 2008/0055712 A1 | 3/2008 | Noelscher |
| 2009/0032740 A1 | 2/2009 | Smith et al. |
| 2009/0230326 A1 | 9/2009 | Vaschenko et al. |
| 2010/0045197 A1* | 2/2010 | Kessels ............... H01J 9/247 315/246 |
| 2010/0181503 A1 | 7/2010 | Yanagida |
| 2011/0181191 A1* | 7/2011 | Smith ............... B82Y 10/00 315/149 |
| 2011/0204265 A1* | 8/2011 | Smith ............... B82Y 10/00 250/503.1 |
| 2012/0112624 A1* | 5/2012 | Jeong ............... H01J 61/305 313/493 |
| 2013/0329204 A1 | 12/2013 | Pellemans et al. |
| 2014/0126043 A1 | 5/2014 | Senekerimyan |
| 2014/0362600 A1* | 12/2014 | Suckling ............... F21S 48/1145 362/583 |
| 2015/0262808 A1* | 9/2015 | Wang ............... H01J 65/04 315/111.21 |
| 2016/0057845 A1 | 2/2016 | Smith |

FOREIGN PATENT DOCUMENTS

| | | |
|---|---|---|
| EP | 1 335 640 A2 | 8/2003 |
| FR | 2554302 A | 5/1985 |
| JP | S61-193358 A | 8/1986 |
| JP | 08299951 | 11/1996 |
| JP | 2003-317675 A | 11/2003 |
| JP | H04-144053 A | 11/2004 |
| JP | 2006010675 A | 1/2006 |
| NL | 8403294 | 6/1985 |
| WO | 2004097520 A2 | 11/2004 |
| WO | WO2007120521 | 5/2006 |
| WO | WO2010002766 | 1/2010 |
| WO | 2010093903 | 8/2010 |

OTHER PUBLICATIONS

D. Keefer, "Laser Sustained Plasmas,"Chapter 4, in Radziemski et al., "Laser-Induced Plasmas and Applications," CRC Press (1989).
Norbert R. Böwering et al., "EUV Source Collector," Proc. of SPIE vol. 6151, (Mar. 10, 2006).
William T. Silfvast, Laser Fundamentals, 2d ed., pp. 1-6 (2004).

(56) References Cited

OTHER PUBLICATIONS

Arp et al., Feasibility of generating a useful laser-induced breakdown spectroscopy plasma on rocks at high pressure: preliminary study for a Venus mission, published Jul. 30, 2004.
J. Uhlenbusch and W. Viöl, "Hβ-Line Profile Measurements in Optical Discharges", J. Quant. Spectrosc. Radiat. Transfer, vol. 44, No. 1, 47-56 (1990).
Partial Search Report for PCT/US2016/021983 dated Aug. 16, 2016.
DS004 EQ-10M—Data Sheet, Energetiq, 2005.
John Powell and Claes Magnusson; Handbook of Laser Technologies and Applications vol. III Applications, Part D: 1.2, pp. 1587-1611; 2004, published by Institute of Physics Publishing.
Digonnet, Michel J.F., editor; Rare-Earth-Doped-Fiber Lasers and Amplifiers, Second Edition, Revised and Expanded, published by Marcel Dekker, Inc., 2001, pp. 144-170.
Cremers, at al; Evaluation of the Continuous Optical Discharge for Spectrochemical Analysis; Speohtrochirnica Acta, Part B. Atomic Spectroscopy; vol. 408 No. 4, 1985.
ASML's customer magazine, 2014, ASML Holding BV.
Raizer, Yuri P.; Gas Discharge Physics, Springer-Verlag 1991; pp. 35-51; 307-310.
Raizer, Yuri P.; Gas Discharge Physics, Springer-Verlag corrected and printing 1997; pp. 35-51; 307-310.
V. P. Zimakov, et al; Interaction of Near-IR Laser Radiation with Plasma of a Continuous Optical Discharge; Plasma Physics Reports, 2016, vol. 42, No. 1, pp. 68-73.
Bezel, et al "High Power Laser-Sustained Plasma Light Sources for KLA-Tencor Broadband Inspection Tool"; Conference Paper—May 2015, KLATencor, Milpitas, California.
Energetiq Technology, Inc.; LDLS™ Laser-Driven Light Source EQ-100 High Brightness DUV Light Source Data Sheet; 2008; Woburn, Massachusetts.
Rudoy, et al; Xenon Plasma Sustained by Pulse-Periodic Laser Radiation; Plasma Physics Reports, 2015, vol. 41, No. 10, pp. 856-861. Pleiades Publishing, Ltd., 2015.
Knecht, et al; Optical pumping of the XeF(C-+A) and iodine 1.315-pm lasers by a compact surface discharge system; Opt. Eng. 42(12) 3612-3621 (Dec. 2003).
Fridman, et al; Plasma Physics and Engineering; Published in 2004 by Taylor & Francis, pp. 404-419; 615-619.
Model EQ-99 LDLS™ Laser-Driven Light Source; Operation and Maintenance Manual Revision Mar. 2, 2012.
Martin van den Brink; Many ways to shrink: The right moves to 10 nanometer and beyond; Presentation at ASML SmallTalk 2014; London; Nov. 2014.
Laser Pumped Plasma Broadband Light Souce by RnD Isan (no date).
Toumanov; Plasma and High Frequency Processes for Obtaining and Processing Materials in the Nuclear Fuel Cycle; Nova Science Publishers, Inc., New York, 2003, p. 60.
Klaurninzer; Cost Considerations for Industrial Excimer Lasers; Laser Focus, the Magazine of Electro-Optics Technology; Dec. 1985.
S. C. Tidwell, ; Highly efficient 60-W TEMoo cw diode-end-pumped Nd:YAG laser, Optics Letters / vol. 18, No. 2 / Jan. 15, 1993, pp. 116-118.
R. J. Shine, Jr; 40-W cw, TEM00-mode, diode-laser-pumped, Nd:YAG miniature-slab laser; Mar. 1, 1995 / vol. 20, No. 5 / Optics Letters, pp. 459-461.
W. Schone, et al; Diode-Pumped High-Power cw Nd:YAG Lasers; W. Waidelich, et al (eds.); Laser in Forschung and Technik; 1996.
Diogiovanni, et al; High Power Lasers and Amplifiers; Optics & Photonics News, Jan. 1999.
ASML YieldStar T-250D product sheet; ASML Product Catalog; Jan. 20, 2014.
ASML YieldStar S-250D product sheet; SML Product Catalog; Jan. 20, 2014.
Energetiq Technology Inc; Operation manual for LDLS™ Laser-Driven Light Source; Aug. 2009.
Bussiahn; Experimental and theoretical investigations of a low-pressure HE-Xe discharge for lighting purpose; Jounral of Applied Physics vol. 95, May 1, 2004.
V.P. Zimakov, et al; Bistable behavior of a continuous optical discharge as a laser beam propagation effect; Laser Resonators, Microresonators, and Beam Control XV; vol. 8600, 860002 • © 2013 SPIE.
Fridman, et al; Plasma Physics and Engineering, Second Edition; Published in 2011 by Taylor & Francis, pp. 409-424; 639-640.
Energetiq Technology, Inc.; Model EQ-1500, LDLS™ Laser-Driven Light Source, Operation Manual, May 2011.
Energetiq Technology, Inc.; Model EQ-77 LDLS™ Laser-Driven Light Source Operation Manual, Dec. 2015.
Energetiq Technology, Inc.; Model EQ-90-FC, LDLS™, Laser-Driven Light Source, Operation and Maintenance Manual, Jan. 2014.
Raizer, "Optical discharges," Soviet Physics Uspekhi 23(11)(1980).
Energetiq Technology, Inc.; Operation and Maintenance Manual, Model EQ-99X, LDLS Laser-Driven, Light Source, Rev. 1 (Jan. 2014).
Energetiq Technology, Inc.; Operation and Maintenance Manual, EQ-99-FC, LDLS Laser-Driven Light Source, Rev. 2 (Mar. 2012).
Energetiq Technology, Inc.; Operation and Maintenance Manual, Model EQ-99X-FC, LDLS Laser-Driven Light Source, Rev. 1 (Jan. 2014).
Energetiq Technology, Inc.; Operation and Maintenance Manual, Model EQ-9-N, LDLS Laser-Driven Light Source, Rev. 6 (Sep. 2015).
Energetiq Technology, Inc.; A presentation titled "EQ-400 LDLS Laser-Driven Light Source," dated Feb. 2, 2015.
A presentation titled "Energetiq Laser-Driven Light Sources," dated Apr. 21, 2015.
A presentation titled "ASML BV LDLS Roadmap," dated Jun. 11, 2013.
Nanometrics, Organic Growth Opportunities for Nanometrics in Process Control.
A presentation titled "LDLS Laser-Driven Light Source," dated Jul. 8, 2011.
Castellano, "Are the Brains at ASML Hurting Investors With High and Ambitious R&D Costs?" Jul. 20, 2015.
M. W. P. Cann, Light Sources in the 0.15-20-μ Spectral Range, vol. 8, No. 8 Applied Optics (1969).
Kuhn, Kelin; Laser Engineering; Prentice-hall Inc, 1998; pp. 384-440.
Moulton, Peter F.; Tunable Solid-State Lasers; Proceedings of the IEEE, vol. 80, No. 3, Mar. 1992.
Koch, K.K.; Sodium Plasma Produced by Milliwatt cw Laser Irradiation; Journal of the Optical Society of America; vol. 70, No. 6, Jun. 1980.
E. B. Saloman; Energy Levels and Observed Spectral Lines of Xenon, XeI through XeLIV; J. Phys. Chem. Ref. Data, vol. 33, No. 3, 2004.
Lothar Klein; Measurements of Spectral Emission and Absorption of a High Pressure Xenon Arc in the Stationary and the Flashed Modes; Apr. 1968; vol. 7, No. 4, Applied Optics.
Hailong Zhou, et al; Conductively cooled high-power, high-brightness bars and fiber coupled arrays; High-Power Diode Laser Technology and Applications III, edited by Mark S. Zediker, Proc. of SPIE vol. 5711 (SPIE, Bellingham, WA, 2005).
Ytterbium-doped large-core fibre laser with 1 kW of continuous-wave output power; Y. Jeong, et al; Electronics Letters Apr. 15, 2004 vol. 40 No. 8.
H.M. Pask, et al; Ytterbium-Doped Silica Fiber Lasers: Versatile Sources for the 1-1.2 um Region; IEEE Journal of Selected Topics in Quantum Electronics vol. 1, No. 1; Apr. 1993.
Christian Stewen; A 1-kW CW Thin Disc Laser; IEEE Journal of Selected Topics in Quantum Electronics, vol. 6, No. 4, Jul./Aug. 2000.
Hecht, Eugene: Optics, 4ed; Pearson Addison Wesley; 2002; pp. 149-171, 243-273; 385-442.
KLA-Tencor; High Power Laser-Sustained Plasma Light Sources for KLA-Tencor Broadband Inspection Tools; Conference Paper • May 2015.

(56) References Cited

OTHER PUBLICATIONS

Davis, Christopher C.; Lasers and Electro-Optics: Fundamentals and Engineering; 1996, Cambridge University Press, pp. 14-35.
Tam, Quasiresonant laser-produced plasma: an efficient mechanism for localized breakdown; J. Appl. Phys. 51(9), Sep. 1980, p. 4682.
Measures, et al; Laser Interaction based on resonance saturation (LIBORS): an alternative to inverse bremsstrahlung for coupling laser energy into a plasma; Applied Optics, vol. 18, No. 11, Jun. 1, 1979.
Eletskii et al; Formation kinetics and parameters of a photoresonant plasma; Soh. Phys. JETP 67 (5); May 1988.
Ballman, et al; Synthetic Quartz with High Ultraviolet Transmission; Applied Optics; Jul. 1968, vol. 7, No. 7.
Energetiq Technology, Inc, LDLS™ Laser-Driven Light Source Data Sheet; 2008.
Patel and Zaidi, The suitability of sapphire for laser windows, MEas. Sci. Technol. 10 (1999).
Waynant, et al; Electro-Optics Handbook, Second Edition; Chapter 10; published by McGraw-Hill, 2000.
Excelites Technologies Corp.; Cermax® Xenon Lamp Engineering Guide, 2011.
Perkinelmer Optoelectronics; Cermax® Xenon Lamp Engineering Guide, 1998.
G C Wei; Transparent ceramic lamp envelope materials, J. Phys. D. Appl. Phys. 38 (2005) 3057-3065.
PASCO Scientific; Instruc:tion Sheet for the PASCO Model OS-9286A Mercury Vapor Light Source; 1990.
Generalov et al; "Continuous Optical Discharge," ZhETF Pis. Red. 11, No. 9, May 5, 1970, pp. 302-304.
Kozlov et al; "Radiative Losses by Argon Plasma and the Emissive Model of a Continuous Optical Discharge"; Sov. Phys. JETP, vol. 39, No. 3, Sep. 1974, pp. 463-468.
Wilbers et al, "The Continuum Emission of an Arc Plasma," J. Quant Spectrosc. Radiat. Transfer, vol. 45, No. 1, 1991, pp. 1-10.
Wilbers, et al "The VUV Emissitivity of a High-Pressure Cascade Argon Arc from 125 to 200 nm," J.Quant. Spectrosc. Radiat. Transfer, vol. 46, 1991, pp. 299-308.
Luxtell LLC CeraLux Xenon Lamps Product Data Sheet; 2003-2004.
Laufer; Gabriel; Introduction to Optics and Lasers in Engineering; pp. 449-454; Cambridge University Press, 1996.
Yu, et al; LED-Based Projection Systems; Journal of Display Technology, vol. 3, No. 3, Sep. 2007.
Derra et al; UHP lamp systems for projection applications; J. Phys. D: Appl. Phys. 38 (2005) 2995-3010.
Ingle, James D., et al; Spectrochemical Analysis; 1988, Prentice-Hall Inc.; p. 59.

M.J. Soileau et al., Laser-Induced Damage Measurements in CdTe and Other II-VI Materials, Applied Optics, vol. 21, No. 22, pp. 4059-4062.
Roy Henderson et al., Laser Safety, pp. 435-443 (2004).
Turan Erdogan, Ph.D., CTO Semrock, Inc., A Unit of IDEX Corp; letter dated Feb. 28, 2011 regarding Energetiq Technology's EQ-99 system.
Winners of 2010 Prism Awards Announced, Jan. 27, 2011; webpage from photonics.com.
http://www.rdmag.com/award-winners/2011/08/light-source-life-time-lifted-laser-tech; The EQ-99 LDLS Laser-Driven Light Source, produced by Energetiq Technology Inc. 2011.
Energetic Technology Inc. Press Release: Energetiq Announces Ultra-Compact Light Source for Next Generation HPLC and Advanced Microscopy; Jan. 21, 2010.
KLA-Tencor Launches 2830 and Puma 9500 Series, eDR-5210 | Product Releases |Press Releases; Jul. 13, 2009.
Nanometrics, Organic Growth Opportunities for Nanometrics in Process Control, Jan. 2016.
M.J. Soileau et al., Laser-Induced Damage Measurements in CdTe and Other II-VI Materials, Applied Optics, vol. 21, No. 22, pp. 4059-4062; Nov. 15, 1982.
International Search Report and Written Opinion for PCT/U52015/030740, dated Oct. 20, 2015.
Bussiahn, R. et al. "Experimental and theoretical investigations of a low-pressure He-Xe discharge for lighting purpose" Journal of Applied Physics, vol. 95, No. 9, May 1, 2004, pp. 4627-4634.
Beck, Simple Pulse Generator for Pulsing Xenon Arcs with High Repetition Rate, Rev. Sci. Instrum., vol. 45, No. 2, Feb. 1974, pp. 318-319.
Carlhoff, et al, "Continuous Optical Discharges at Very High Pressure," Physica 103C, pp. 439-447.
Fiedorowicz et al, X-Ray Emission from Laser-Irradiated Gas Puff Targets, Appl. Phys. Lett. 62 (22). May 31, 1993.
Franzen, "CW Gas Breakdown in Argon Using 10.6-um Laser Radiation," Appl. Phys. Lett. vol. 21, No. 2, Jul. 15, 1972 pp. 52-64.
Generalov et al "Continuous Optical Discharge," ZhETF Pis. Red. 11, No. 9, May 5, 1970, pp. 302-304.
Jeng et al, Theoretical Investigation of Laser-sustained Argon Plasmas J Appl. Phys. 60 (7), Oct. 1, 1986 pp. 2272-2279.
Nakar, "Radiometric Characterization of Ultrahigh Radiance Xenon Short-arc Discharge Lamps" Applied Optics, vol. 47, No. 2, Jan. 9, 2008, pp. 224-229.
Moody, "Maintenance of a Gas Breakdown in Argon using 10.6-u cw Radiation," Journal of Applied Physics, vol. 46, No. 6, Jun. 1975, pp. 2475-2482.
Keefer et al "Experimental Study of a Stationary Lesser-Sustained Air Plasma", Journal of Applied Physics, vol. 46., No. 3, Mar. 1975, pp. 1080-1083.

\* cited by examiner

FIG. 1
(PRIOR ART)
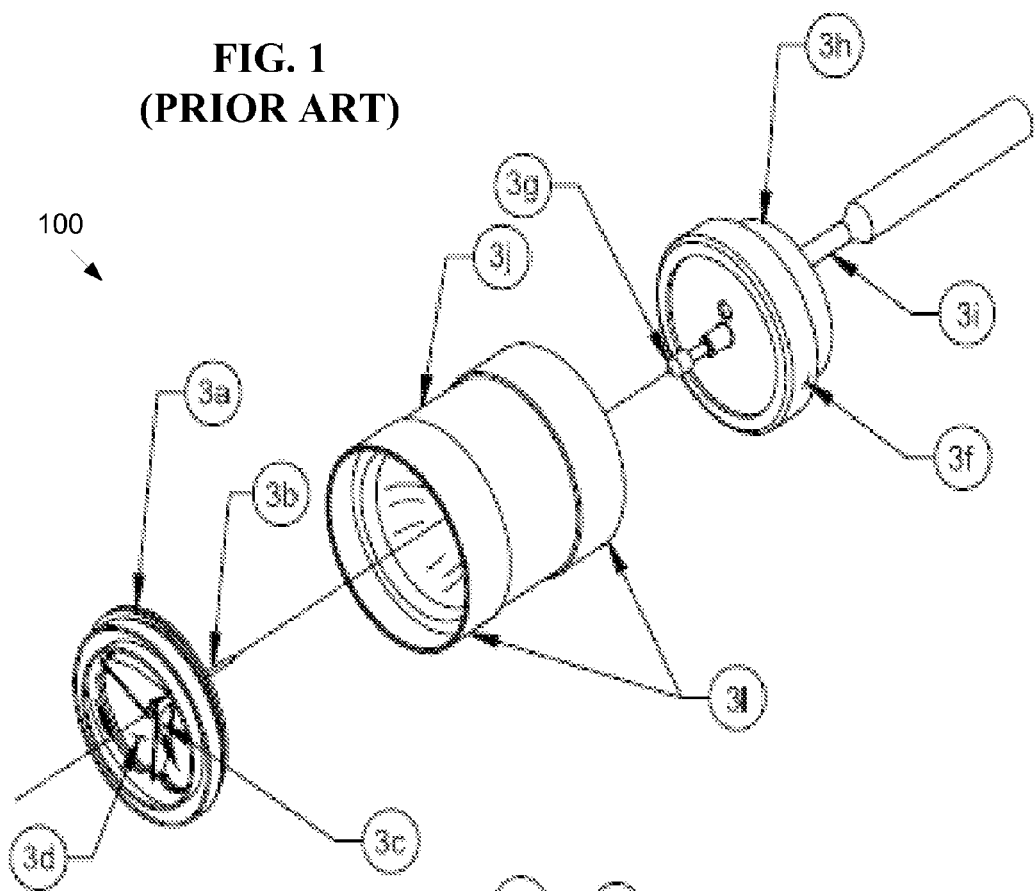
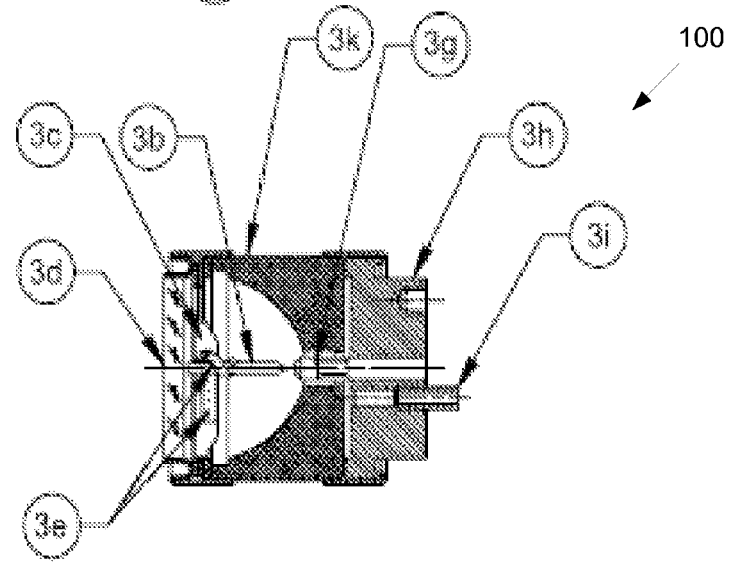
FIG. 2
(PRIOR ART)

```
┌─────────────────────────────────────────────────────────────┐
│  Provide a window configured to receive energy from a       │
│  continuous wave laser light source disposed outside a      │
│  sealed lamp chamber to a focal region within the chamber   │
│                          710                                │
└─────────────────────────────────────────────────────────────┘
                              │
                              ▼
┌─────────────────────────────────────────────────────────────┐
│  Set a pressure of the chamber to a predetermined pressure  │
│  level                                                      │
│                          720                                │
└─────────────────────────────────────────────────────────────┘
                              │
                              ▼
┌─────────────────────────────────────────────────────────────┐
│  Focus the laser light source to a focal region within the  │
│  chamber having a predetermined volume                      │
│                          730                                │
└─────────────────────────────────────────────────────────────┘
                              │
                              ▼
┌─────────────────────────────────────────────────────────────┐
│  Ignite the ionizable medium within the chamber with the    │
│  laser light source to form a plasma                        │
│                          740                                │
└─────────────────────────────────────────────────────────────┘
                              │
                              ▼
┌─────────────────────────────────────────────────────────────┐
│  Sustain the plasma within the chamber with the continuous  │
│  wave laser light source                                    │
│                          750                                │
└─────────────────────────────────────────────────────────────┘

ELECTRODELESS SINGLE CW LASER DRIVEN XENON LAMP

FIELD OF THE INVENTION

The present invention relates to illumination devices, and more particularly, is related to high intensity lamps.

BACKGROUND OF THE INVENTION

High intensity arc lamps are devices that emit a high intensity beam. The lamps generally include a gas containing chamber, for example, a glass bulb, with an anode and cathode that are used to excite the gas within the chamber. An electrical discharge is generated between the anode and cathode to provide power to the excited (e.g. ionized) gas to sustain the light emitted by the ionized gas during operation of the light source.

FIG. 1 shows a pictorial view and a cross section of a low-wattage parabolic prior art Xenon lamp 100. The lamp is generally constructed of metal and ceramic. The fill gas, Xenon, is inert and nontoxic. The lamp subassemblies may be constructed with high-temperature brazes in fixtures that constrain the assemblies to tight dimensional tolerances. FIG. 2 shows some of these lamp subassemblies and fixtures after brazing.

There are three main subassemblies in the prior art lamp 100: cathode; anode; and reflector. A cathode assembly 3a contains a lamp cathode 3b, a plurality of struts holding the cathode 3b to a window flange 3c, a window 3d, and getters 3e. The lamp cathode 3b is a small, pencil-shaped part made, for example, from thoriated tungsten. During operation, the cathode 3b emits electrons that migrate across a lamp arc gap and strike an anode 3g. The electrons are emitted thermionically from the cathode 3b, so the cathode tip must maintain a high temperature and low-electron-emission to function.

The cathode struts 3c hold the cathode 3b rigidly in place and conduct current to the cathode 3b. The lamp window 3d may be ground and polished single-crystal sapphire (AlO2). Sapphire allows thermal expansion of the window 3d to match the flange thermal expansion of the flange 3c so that a hermetic seal is maintained over a wide operating temperature range. The thermal conductivity of sapphire transports heat to the flange 3c of the lamp and distributes the heat evenly to avoid cracking the window 3d. The getters 3e are wrapped around the cathode 3b and placed on the struts. The getters 3e absorb contaminant gases that evolve in the lamp during operation and extend lamp life by preventing the contaminants from poisoning the cathode 3b and transporting unwanted materials onto a reflector 3k and window 3d.

The anode assembly 3f is composed of the anode 3g, a base 3h, and tubulation 3i. The anode 3g is generally constructed from pure tungsten and is much blunter in shape than the cathode 3b. This shape is mostly the result of the discharge physics that causes the arc to spread at its positive electrical attachment point. The arc is typically somewhat conical in shape, with the point of the cone touching the cathode 3b and the base of the cone resting on the anode 3g. The anode 3g is larger than the cathode 3b, to conduct more heat. About 80% of the conducted waste heat in the lamp is conducted out through the anode 3g, and 20% is conducted through the cathode 3b. The anode is generally configured to have a lower thermal resistance path to the lamp heat sinks, so the lamp base 3h is relatively massive. The base 3h is constructed of iron or other thermally conductive material to conduct heat loads from the lamp anode 3g.

The tubulation 3i is the port for evacuating the lamp 100 and filling it with Xenon gas. After filling, the tabulation 3i is sealed, for example, pinched or cold-welded with a hydraulic tool, so the lamp 100 is simultaneously sealed and cut off from a filling and processing station. The reflector assembly 3j consists of the reflector 3k and two sleeves 3l. The reflector 3k may be a nearly pure polycrystalline alumina body that is glazed with a high temperature material to give the reflector a specular surface. The reflector 3k is then sealed to its sleeves 3l and a reflective coating is applied to the glazed inner surface.

During operation, the anode and cathode become very hot due to electrical discharge delivered to the ionized gas located between the anode and cathode. For example, ignited Xenon plasma may burn at or above 15,000 C, and a tungsten anode/cathode may melt at or above 3600 C degrees. The anode and/or cathode may wear and emit particles. Such particles can impair the operation of the lamp, and cause degradation of the anode and/or cathode.

One prior art sealed lamp is known as a bubble lamp, which is a glass lamp with two arms on it. The lamp has a glass bubble with a curved surface, which retains the ionizable medium. An external laser projects a beam into the lamp, focused between two electrodes. The ionizable medium is ignited, for example, using an ultraviolet ignition source, a capacitive ignition source, an inductive ignition source, a flash lamp, or a pulsed lamp. After ignition the laser generates plasma, and sustains the heat/energy level of the plasma. Unfortunately, the curved lamp surface distorts the beam of the laser. A distortion of the beam results in a focal area that is not sharply defined. While this distortion may be partially corrected by inserting optics between the laser and the curved surface of the lamp, such optics increase cost and complexity of the lamp, and still do not result in a precisely focused beam.

Other lamps rely on ignition of a plasma by use of a high energy pulsed laser. Once the plasma has been ignited, a lower energy continuous wave (CW) laser is used to sustain the plasma. However, use of both a high energy pulsed laser and a lower energy CW laser adds cost, bulk, and complexity to the lamp. Therefore, there is a need to address one or more of the above mentioned shortcomings.

SUMMARY OF THE INVENTION

Embodiments of the present invention provide an electrodeless single continuous wave (CW) laser driven lamp. Briefly described, the present invention is directed to an ignition facilitated electrodeless sealed high intensity illumination device. The device is configured to receive a laser beam from a CW laser light source. A sealed chamber is configured to contain an ionizable medium. The chamber has an ingress window disposed within a wall of a chamber interior surface configured to admit the laser beam into the chamber, a plasma sustaining region, and a high intensity light egress window configured to emit high intensity light from the chamber. A path of the CW laser beam from the laser light source through the ingress window to a focal region within the chamber is direct. The ingress window is configured to focus the laser beam to within a predetermined volume, and the plasma is configured to be ignited by the CW laser beam, optionally by direct or indirect heating of a non-electrode ignition agent located entirely within the chamber.

Other systems, methods and features of the present invention will be or become apparent to one having ordinary skill in the art upon examining the following drawings and

BRIEF DESCRIPTION OF THE DRAWINGS

The accompanying drawings are included to provide a further understanding of the invention, and are incorporated in and constitute a part of this specification. The components in the drawings are not necessarily to scale, emphasis instead being placed upon clearly illustrating the principles of the present invention. The drawings illustrate embodiments of the invention and, together with the description, serve to explain the principals of the invention.

FIG. 1 is a schematic diagram of a prior art high intensity lamp in exploded view.

FIG. 2 is a schematic diagram of a prior art high intensity lamp in cross-section view.

FIG. 7 is a flowchart of a first exemplary method for operating a laser driven electrodeless sealed beam lamp.

DETAILED DESCRIPTION

Figure 3:
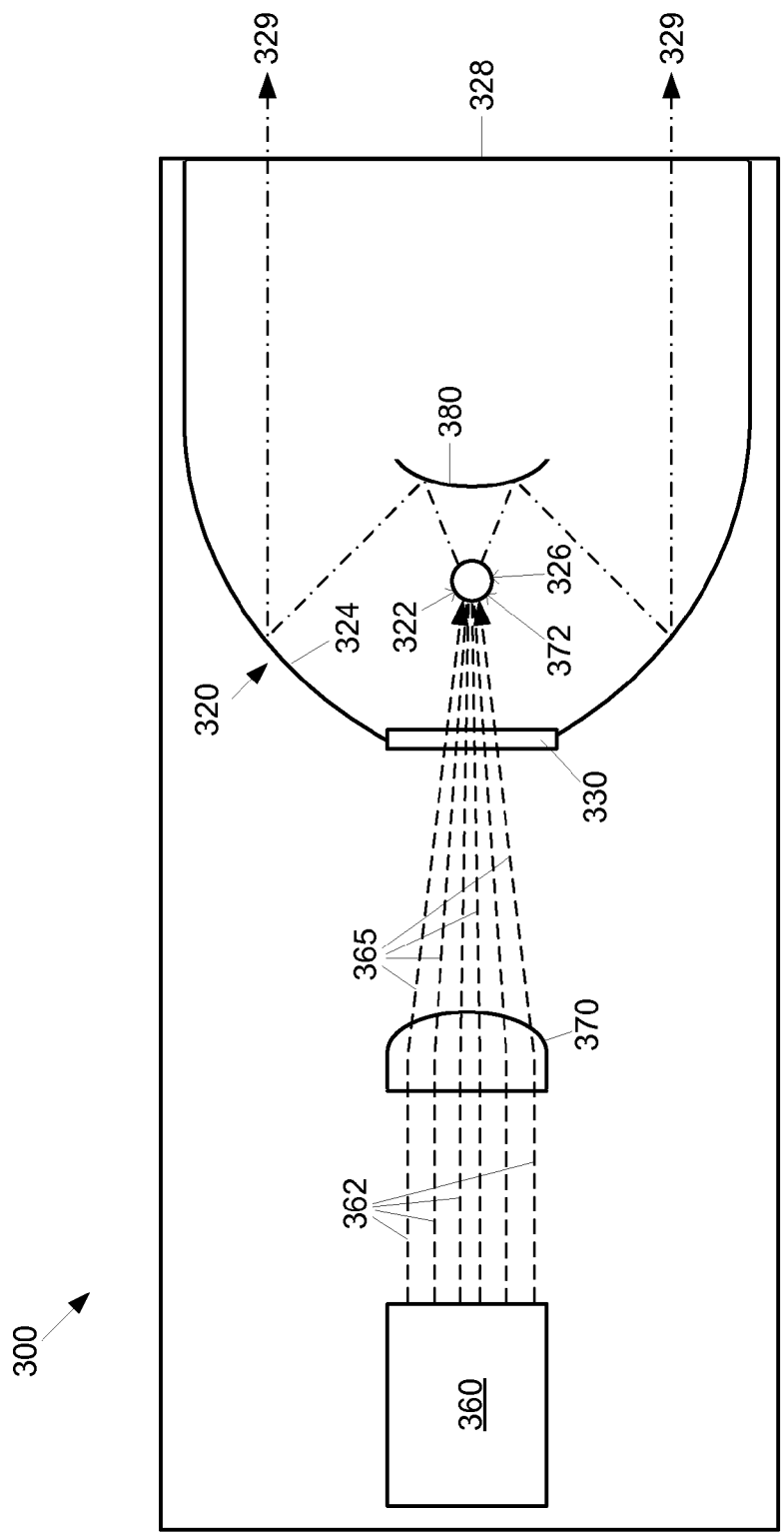
FIG. 3 is a schematic diagram of a first exemplary embodiment of a laser driven electrodeless sealed beam lamp.

The following definitions are useful for interpreting terms applied to features of the embodiments disclosed herein, and are meant only to define elements within the disclosure. No limitations on terms used within the claims are intended, or should be derived, thereby. Terms used within the appended claims should only be limited by their customary meaning within the applicable arts.

Reference will now be made in detail to embodiments of the present invention, examples of which are illustrated in the accompanying drawings. Wherever possible, the same reference numbers are used in the drawings and the description to refer to the same or like parts.

As described above, previous sealed plasma lamps have relied on ignition either by electrodes entering into a plasma chamber, or by a high energy pulsed laser. In contrast, the embodiments described below are directed to igniting a plasma in Xenon lamps of multiple constructions by use of a single CW laser under specified conditions. In general, these conditions for ignition include, as a baseline, laser power starting at around 200 Watts and higher, a minimum focal point size for the laser light within the chamber, a minimal lamp fill pressure, for example, starting at 350 psi or higher.

In general, each of these embodiments includes an ingress window admitting laser light into the chamber where the ingress window is flat, or incorporates a focusing lens. It is important to note that the high fill pressures to enable auto-ignition in the embodiments described below are not feasible in prior art quartz bubble lamps.

FIG. 3 shows a first exemplary embodiment of an electrodeless laser driven sealed beam lamp 300. The lamp 300 includes a sealed chamber 320 configured to contain an ionizable medium, for example, Xenon, Argon or Krypton gas. The chamber 320 is generally pressurized, for example to a pressure level in the range of 290-1150 psi. In contrast, Xenon quartz "bubble" lamps are typically at 250-300 psi. At higher pressures the plasma spot may be smaller and the efficiency of the laser energy to photon conversion improves. The smaller spot size at higher pressures may be advantageous for coupling into small apertures, for example, a fiber aperture when 1:1 reflection is used between the focus point of the lamp and the fiber aperture. The chamber 320 has an egress window 328 for emitting high intensity egress light 329. The egress window 328 may be formed of a suitable transparent material, for example quartz glass or sapphire, and may be coated with a reflective material to reflect specific wavelengths. The reflective coating may block the laser beam wavelengths from exiting the lamp 300, or may be configured to pass wavelengths in a certain range such as visible light, or prevent UV energy from exiting the lamp 300. The egress window 328 may also have an anti-reflective coating to increase the transmission of rays of the intended wavelengths. This may be a partial reflection or spectral reflection, for example to filter unwanted wavelengths from egress light 329 emitted by the lamp 300. An egress window 328 coating that reflects the wavelength of the ingress laser light 365 back into the chamber 320 may lower the amount of energy needed to maintain plasma within the chamber 320.

The chamber 320 may have a body formed of metal, sapphire or glass, for example, quartz glass. The chamber 320 has an integral reflective chamber interior surface 324 configured to reflect high intensity light toward the egress window 328. The interior surface 324 may be formed according to a shape appropriate to maximizing the amount of high intensity light reflected toward the egress window 328, for example, a parabolic or elliptical shape, among other possible shapes. In general, the interior surface 324 has a focal point 322, where high intensity light is located for the interior surface 324 to reflect an appropriate amount of high intensity light.

The high intensity egress light 329 output by the lamp 300 is emitted by a plasma formed of the ignited and energized ionizable medium within the chamber 320. The ionizable medium is ignited within the chamber 320 by one of several means, as described further below, within the chamber 320. The plasma is continuously generated and sustained at a plasma generating and/or sustaining region 326 within the chamber 320 by energy provided by ingress laser light 365 produced by a laser light source 360 located within the lamp 300 and external to the chamber 320. In the first embodiment, the plasma sustaining region 326 is co-located with a focal point 322 of the interior surface 324 at a fixed location. In alternative embodiments the laser light source 360 may be external to the lamp 300.

The chamber 320 has a substantially flat ingress window 330 disposed within a wall of the interior surface 324. The substantially flat ingress window 330 conveys the ingress laser light 365 into the chamber 320 with minimal distortion or loss, particularly in comparison with light conveyance through a chamber window having one or two curved surfaces. The ingress window 330 may be formed of a suitable transparent material, for example quartz glass or sapphire.

A lens 370 is disposed in the path between the laser light source 360 and the ingress window 330 configured to focus the ingress laser light 365 to a lens focal region 372 within the chamber. For example, the lens 370 may be configured to direct collimated laser light 362 emitted by the laser light source 360 to the lens focal region 372 within the chamber 320. Alternatively, the laser light source 360 may provide focused light, and transmit focused ingress laser light 365 directly into the chamber 320 through the ingress window 330 without a lens 370 between the laser light source 360 and the ingress window 330, for example using optics within the laser light source 360 to focus the ingress laser light 365 to the lens focal region 372. In the first embodiment, the lens focal region 372 is co-located with the focal point 322 of the interior surface 324 of the chamber 320.

The interior surface and/or the exterior surface of the ingress window 330 may be treated to reflect the high intensity egress light 329 generated by the plasma, while simultaneously permitting passage of the ingress laser light 365 into the chamber 320. The portion of the chamber 320 where laser light enters the chamber is referred to as the proximal end of the chamber 320, while the portion of the chamber 320 where high intensity light exits the chamber is referred to as the distal end of the chamber 320. For example, in the first embodiment, the ingress window 330 is located at the proximal end of the chamber 320, while the egress window 328 is located at the distal end of the chamber 320.

A convex hyperbolic reflector 380 may optionally be positioned within the chamber 320. The reflector 380 may reflect some or all high intensity egress light 329 emitted by the plasma at the plasma sustaining region 326 back toward the interior surface 324, as well as reflecting any unabsorbed portion of the ingress laser light 365 back toward the interior surface 324. The reflector 380 may be shaped according to the shape of the interior surface 324 to provide a desired pattern of high intensity egress light 329 from the egress window 328. For example, a parabolic shaped interior surface 324 may be paired with a hyperbolic shaped reflector 380. The reflector 380 may be fastened within the chamber 320 by struts (not shown) supported by the walls of the chamber 320, or alternatively, the struts (not shown) may be supported by the egress window 328 structure. The reflector 380 also prevents the high intensity egress light 329 from exiting directly through the egress window 328. The multiple reflections of the laser beam past the focal plasma point provide ample opportunity to attenuate the laser wavelengths through properly selected coatings on reflectors 380, interior surface 324 and egress window 328. As such, the laser energy in the high intensity egress light 329 can be minimized, as can the laser light reflected back to the laser 360. The latter minimizes instabilities when the laser beam interferes within the chamber 320.

The use of reflector 380 at preferably an inverse profile of the interior surface 324, ensure that no photons, regardless of wavelength, exit the egress window 328 through direct line radiation. Instead, all photons, regardless of wavelength, exit the egress window 328 bouncing off the interior surface 324. This ensures all photons are contained in the numerical aperture (NA) of the reflector optics and as such can be optimally collected after exiting through the egress window 328. The non-absorbed IR energy is dispersed toward the interior surface 324 where this energy may either be absorbed over a large surface for minimal thermal impact or reflected towards the interior surface 324 for absorption or reflection by the interior surface 324 or alternatively, reflected towards the egress window 328 for pass-through and further processed down the line with either reflecting or absorbing optics.

The laser light source 360 is a continuous wave (CW) laser, rather than a pulsed laser. The laser light source 360 may be a single laser, for example, a single infrared (IR) laser diode, or may include two or more lasers, for example, a stack of IR laser diodes. The wavelength of the laser light source 360 is preferably selected to be in the near-IR to mid-IR region as to optimally and economically pump the Xenon gas with available off-the-shelf lasers. However, the laser light source 360 may alternatively produce far-IR wavelengths, for example, a 10.6 um $CO_2$ laser. A plurality of IR wavelengths may be applied for improved coupling with the absorption bands of the Xenon gas. Of course, other laser light solutions are possible, but may not be desirable due to cost factors, heat emission, size, or energy requirements, among other factors.

It should be noted that while it is generally taught it is preferable to excite the ionizing gas within 10 nm of a strong absorption line, this is not required when creating a thermal plasma, instead of fluorescence plasma. Therefore, the Franck-Condon principle does not necessarily apply. For example, ionizing gas may be excited CW at 1070 nm, 14 nm away from a very weak absorption line (1% point, 20 times weaker in general than lamps using flourescence plasma, for example, at 980 nm emission with the absorption line at 979.9 nm at the 20% point. However a 10.6 μm laser can ignite Xenon plasma even though there is no known absorption line near this wavelength. In particular, $CO_2$ lasers can be used to ignite and sustain laser plasma in Xenon. See, for example, U.S. Pat. No. 3,900,803.

The path of the laser light 362, 365 from the laser light source 360 through the lens 370 and ingress window 330 to the lens focal region 372 within the chamber 320 is direct. The lens 370 may be adjusted to alter the location of the lens focal region 372 within the chamber 320. For example, a control system (not shown) such as an electronic or electro/mechanical control system, may be used to adjust the lens focal region 372 to ensure that the lens focal region 372 coincides with the focal point 322 of the interior surface 324, so that the plasma sustaining region 326 is stable and optimally located. For example, the controller may maintain the desired location of the lens focal region 372 in the presence of forces such as gravity and/or magnetic fields. The controller may incorporate a feedback mechanism to keep the focal region and/or plasma arc stabilized to compensate for changes. The controller may be used to adjust the location of the focal range in one, two, or three axes.

Figure 4:
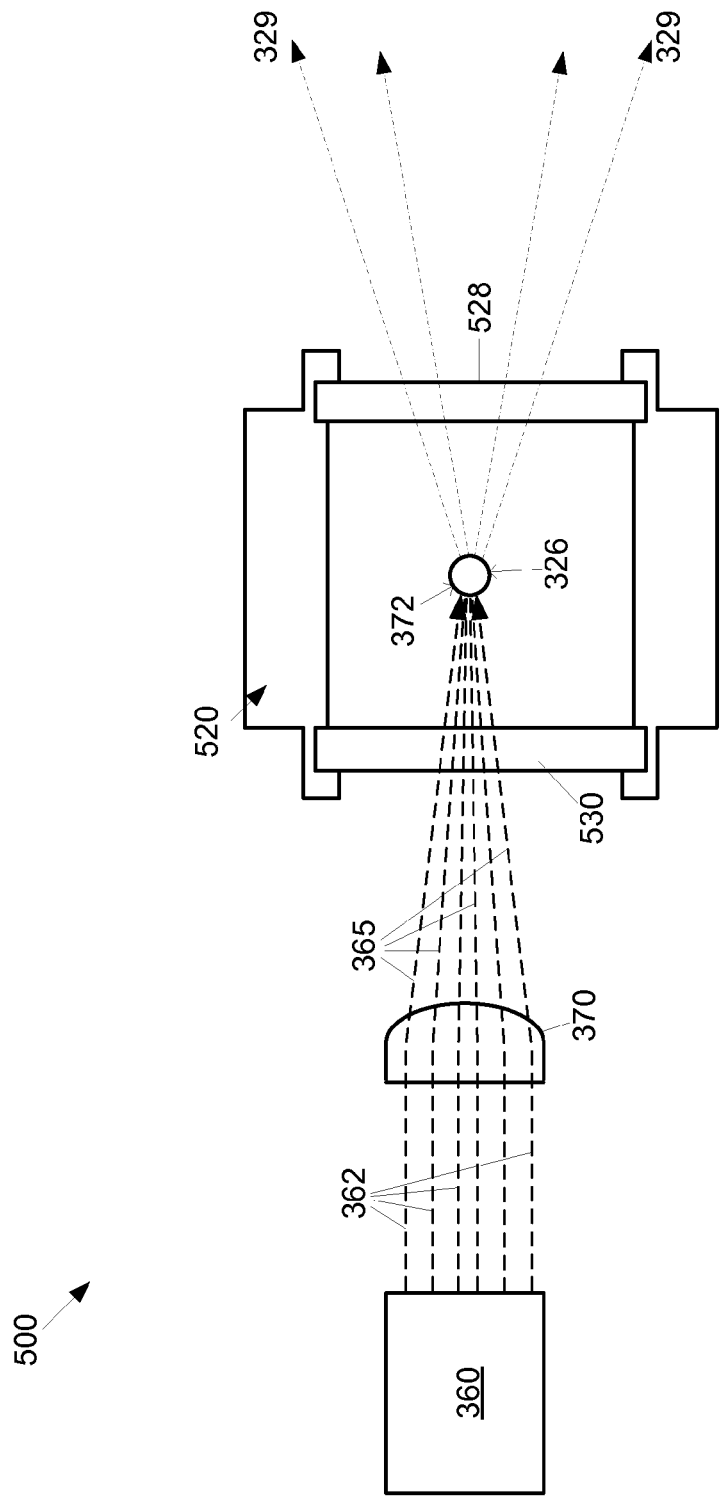
FIG. 4 is a schematic diagram of a second exemplary embodiment of a laser driven electrodeless sealed beam lamp.

FIG. 4 shows a cross sectional view of a second exemplary embodiment of an electrodeless high intensity lamp 500. In contrast with the first embodiment, the sealed chamber 520 is enclosed by a dual window cylindrical housing.

The chamber 520 has a substantially flat ingress window 530, serving as a first wall of the chamber 520. The substantially flat ingress window 530 conveys the ingress laser light 365 into the chamber 520 with minimal distortion or loss, particularly in comparison with light conveyance through a curved chamber surface. The ingress window 530 may be formed of a suitable transparent material, for example quartz glass or sapphire.

The lens 370 is disposed in the path between the laser light source 360 and the ingress window 530 configured to focus the ingress laser light 365 to a lens focal region 372 within the chamber 520, in a similar fashion as the first embodiment. As with the first embodiment, the lens focal region 372 is co-located with the plasma sustaining region 326, and the focal point 322 of the sealed chamber 520.

The location of the plasma sustaining region 326 within the chamber 520 may be variable, as there is no optical focal point, since the cylindrical housing does not need a reflector. However, observations of the cylindrical body indicate that by operating the plasma out of the center, for example, closer to the top of the lamp than the bottom of the lamp, the internal turbulence of the ionized gas is affected, which in turn may impact stability.

The chamber 520 has an egress window 528 for emitting high intensity egress light 529. The egress window 528 may be formed of a suitable transparent material, for example quartz glass or sapphire.

The portion of the chamber 520 where laser light enters the chamber is referred to as the proximal end of the chamber 520, while the portion of the chamber 520 where high intensity light exits the chamber is referred to as the distal end of the chamber 520. For example, in the third embodiment, the ingress window 530 is located at the proximal end of the chamber 520, while the egress window 528 is located at the distal end of the chamber 520.

Optionally, the third embodiment may include elements for adjusting the pressure level of the sealed chamber 520. The sealed lamp 500 may include a pump system 596 connecting an external source of Xenon gas with the sealed chamber 520 via a fill line 592 connecting the external source of Xenon gas with a gas ingress fill/release valve 594.

Methods for ignition of Xenon gas/plasma in the chamber 520 may vary depending upon the amount of pressure and/or temperature within the chamber 520, among other factors. At fill pressures below 325 psi and/or low laser operating power below 200 watt, electrical ignition may be preferable with electrodes, for example with a dual cathode electrical ignition system as discussed in the background section. However, the inclusion of electrodes into the chamber and providing electrical connections of the electrodes adds complexity to the design of the lamp. Therefore, it is an objective of the exemplary embodiments to provide for ignition of the gas/plasma in the chamber that omits electrodes.

Under the first and second embodiments, with sufficiently high pressure/temperature within the chamber 520 a CW laser may be used to thermally ignite Xenon gas within the chamber without the presence of either electrodes or a passive non-electrode igniting agent.

For example, consider a Xenon lamp with flat ingress window filled at 500 psi and operated with a 1070 nm laser through a 0.31 NA focusing optic, to auto ignite at 250 Watt (+/−15%). At 450 psi fill pressure, the same setup requires 265 Watt (+/−15%) of laser power to self-ignite without the use of any ignition agent. At 300 psi fill pressure, the same set-up requires 450 Watt (+/−15%) to self-ignite. In contrast, a quartz bubble lamps filled at 300 psi, fails to self-ignite ignite when exposed to 500 Watt regardless of exposure time. The lensing effect of the typically curved vessel wall prevents obtaining the sufficiently small laser focus beam waist to successfully auto-ignite the enclosed Xenon gas.

A power density in the order of $1 \times 10^{10}$ W/cm$^2$ is generally needed at the beam waist to achieve self-ignition within a fraction of a second of the ionizable medium. This may be achieved under the above described conditions. The power needed to ignite the plasma is impacted by fill pressure of the gas and the excitation laser wavelength. The latter affects the diameter of the beam waist with longer wavelength lasers requiring more power. The former impacts the distance between atoms and affects the energy needed to start the ionization process.

The Numerical Aperture (NA) of the focusing lens equally affects the power needed to self-ignite. A higher NA typically results in a smaller cross sectional beam waist with higher power density as a result. In order for this ignition to succeed, the CW laser light source 360 is focused to a sufficiently small cross section of the beam waist at the lens focal region 372 within the chamber, for example, a cross section on the order of 1-15 micron$^2$. In order to achieve this tight focus, the ingress window 530 of the chamber 520 should preferably be a flat surface. In contrast, if the ingress window has a concave or convex curved surface, for example, the side of a bubble chamber, it may be difficult or impossible to focus the ingress laser light 365 from the CW laser light source 360 into a sufficiently small lens focal region 372 to successfully ignite the plasma within the chamber 520. Alternatively, the ingress window 530 may be fashioned as a lens instead of a flat window, configured to focus the ingress laser light 365 at the focal region 372.

Figure 5:
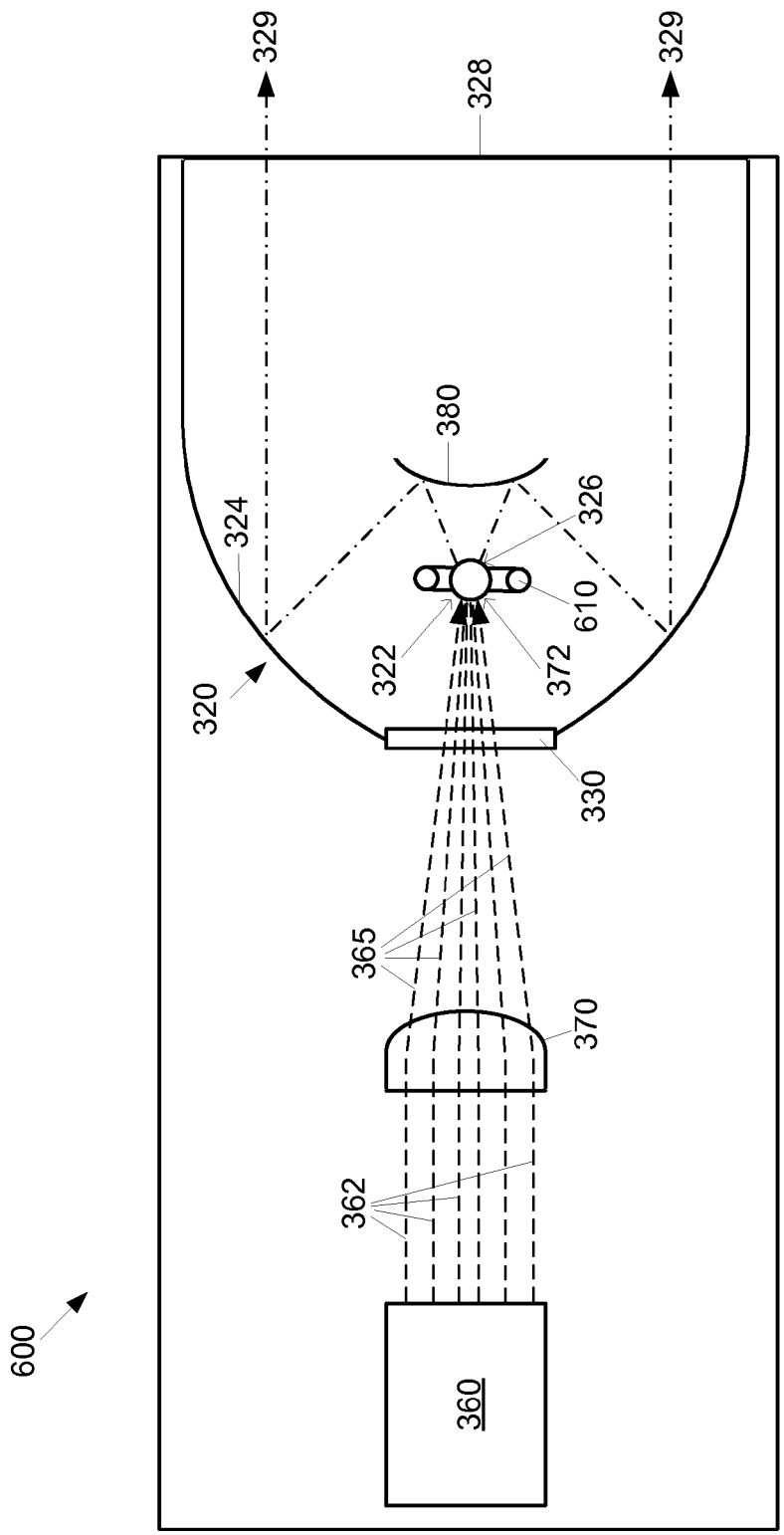
FIG. 5 is a schematic diagram of a third exemplary embodiment of a laser driven electrodeless sealed beam lamp.

Under a third embodiment 600, a passive non-electrode igniting agent 610 is introduced to the chamber 520, as shown in FIG. 5. As used in this disclosure, a passive non-electrode igniting agent 610 is a material introduced into the interior of the chamber 520 that may be excited into producing a stream of charge carriers by stimulation of the CW laser light source 360, and without an externally induced current. In contrast, an electrode would be termed an active ignition source, as it ignites the ionizable medium by actively applying an external electric current to the electrodes. The passive non-electrode igniting agent 610 may include, for example, an ionizing ignition source, such as 2% thoriated tungsten or Kr-85, among others. The self-heating of the Xenon gas with temperature transfer to the passive non-electrode igniting agent 610 causes the passive non-electrode igniting agent 610 to create sufficient charge carriers to self-ignite the Xenon lamp at roughly half the power needed for a non-thoriated solution of the first, and second embodiments. For example, ignition may be caused at an intermediate pressure/temperature range, for example a 450 psi filled xenon lamp self-ignites at 175 Watt (+/−15%), via introduction of a passive non-electrode igniting agent 610, such as thoriated tungsten, internally to the lamp chamber 520.

The third embodiment 600 includes a reflective chamber 520 having the elements of the first embodiment lamp 300 (FIG. 3), in particular, a sealed beam Xenon lamp such as a ceramic or metal body Cermax lamp with integral parabolic or elliptical reflector, and also includes the passive non-electrode igniting agent 610. The passive non-electrode igniting agent 610 is not an active electrode, as no external voltage/current is applied. However, the self-heating of the Xenon gas via a solid state CW laser light source 360 transfers temperature to the passive non-electrode igniting agent 610, for example thoriated materials, creating sufficient charge carriers within the chamber to self-ignite the Xenon lamp at roughly half the power needed for a non-thoriated solution. Preferably, the CW laser light source 360 is focused at a fixed location within the chamber 520, relatively near to the thoriated tungsten 610 to provide expedited heating and thermal ignition. The thoriated tungsten 610 may be configured as a single passive element, a multitude of passive elements in a geometrical configuration, for example, pointed at each other, or as a ring within the chamber 520, such that the CW laser light source 360 is focused at a location close to the passive elements or within the ring of thoriated tungsten 610, such as the center of the ring. For example, the thoriated tungsten ring 610 may be positioned such that the center of the ring is co-located with the lens focal region 372 within the chamber 520, further co-located with the plasma sustaining region 326, and the focal point 322 of the sealed chamber 520. The passive non-electrode igniting agent 610 may not be configured as a ring, for example, the passive non-electrode igniting agent 610 may be configured as a rod, disk, or other configuration such that at least a portion of the passive non-electrode igniting agent 610 is substantially adjacent to the chamber focal region 372. For example, it may be desirable that at least a portion of the passive non-electrode igniting agent 610 may be in the range of 1-5 mm from the focal region 372. It should be noted the appropriate distance of the passive non-electrode igniting agent 610 from the focal region 372 may depend upon other parameters, such as the pressure of the chamber 320, or the power of the CW laser 360.

The same CW laser light source 360 used to ignite the plasma is used to sustain the plasma after ignition. The thoriated tungsten ring 610 may be brazed or floating. It should be noted that in the schematic drawings FIG. 5 and FIG. 6, the thoriated tungsten ring 610 and/or the plasma sustaining region 326 and focal point 322 of the sealed chamber 520 are not necessarily drawn to scale.

Figure 6:
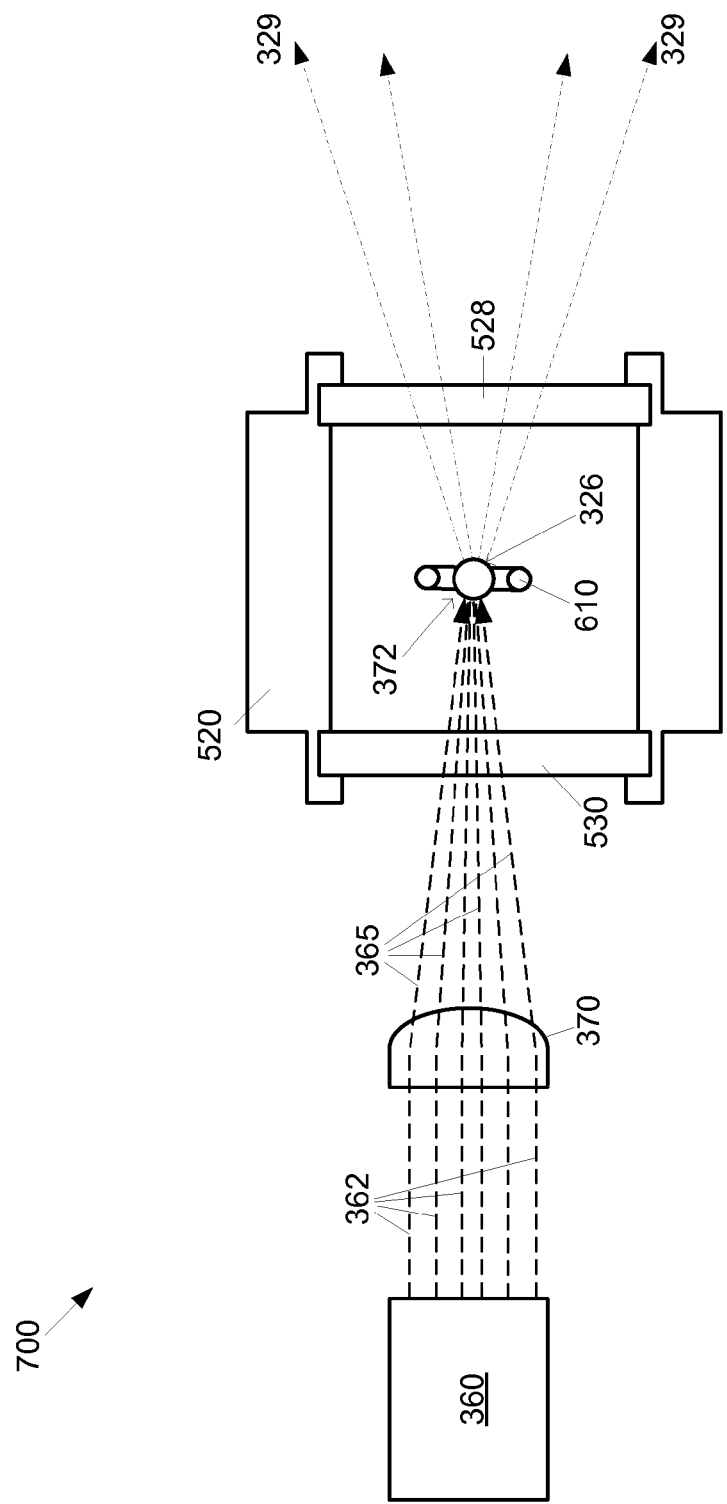
FIG. 6 is a schematic diagram of a fourth exemplary embodiment of a laser driven electrodeless sealed beam lamp.

FIG. 6 shows a cross sectional view of a fourth exemplary embodiment of an electrodeless high intensity lamp 700. In contrast with the third embodiment, the sealed chamber 520 is enclosed by a dual window cylindrical housing. The fourth embodiment 700 includes a cylindrical chamber 520 including the elements of the second embodiment lamp 500 (FIG. 4), and also including the passive non-electrode igniting agent 610.

The lack of electrodes in the above embodiments provides multiple advantages over the prior art. For example, the absence of electrodes in the lamp eliminates tungsten deposits on the walls and windows of the lamp eliminate the main source of light output degradation or reduction in the lamp. No electrodes in the lamp allows for less expensive construction without the need to provide exit seals for the electrodes through the lamp body. The exit seals are known to detoriate over life and to be potentially end-of-life sources for the lamp. No thoriated electrodes in the lamp allows for less ionizing radiation pollution potential. No electrodes through the lamp chamber wall allows for smaller lamp construction which in turn allows for increasing the internal fill pressure, and in turn increasing the conversion efficiency of the lamp. This results in a more robust lamp. In addition, the absence of electrodes eliminates any need for ceramic insulation materials in the lamp. This is advantageous, as ceramic insulation materials may outgas during operation of the lamp and may contribute to light output degradation.

Other advantages of an electrodeless lamp include eliminating the need for a power supply to electrically ignite the lamp. The higher fill pressure facilitates use of smaller lamps, which may reduce cost and increase energy-to-photon conversion efficiency. Elimination of electrodes further removes undesirable side effects of electrodes, such as electrodes interfering with the gas turbulence in the lamp, thereby improving the light output stability. Further, the absence of electrodes eliminates a source of shadows produced by the high intensity light.

FIG. 7 is a flowchart of a first exemplary method for operating a laser driven electrodeless sealed beam lamp. It should be noted that any process descriptions or blocks in flowcharts should be understood as representing modules, segments, portions of code, or steps that include one or more instructions for implementing specific logical functions in the process, and alternative implementations are included within the scope of the present invention in which functions may be executed out of order from that shown or discussed, including substantially concurrently or in reverse order, depending on the functionality involved, as would be understood by those reasonably skilled in the art of the present invention.

Reference is made to FIGS. 3 and 4 regarding the flowchart in FIG. 7. A window, for example ingress window 530 is provided. The window is configured to receive energy from a CW laser light source 360 disposed outside a sealed lamp chamber 320 to a focal region 372 within the chamber 320, as shown by block 710. A pressure level of the chamber 320 is set to a predetermined pressure level appropriate to igniting an ionizable medium within the chamber 320, as shown by block 720. For example, if the CW laser light source is in the range of (250-500 W), a pressure level of (300-600 psi) may be suitable to ignite the ionizable medium with just the CW laser energy. Ingress laser light 365 from the laser light source 360 is focused to a focal region 372 within the chamber 320 having a predetermined volume as shown by block 730, for example a cross sectional beam waist of 1 to 15 micron$^2$ with a Rayleigh length of 6-18 microns. The ionizable medium within the chamber 320 is ignited with the laser light source to form a plasma, as shown by block 740. The plasma is sustained within the chamber 320 by the continuous wave laser light source 360, as shown by block 750.

Figure 8:
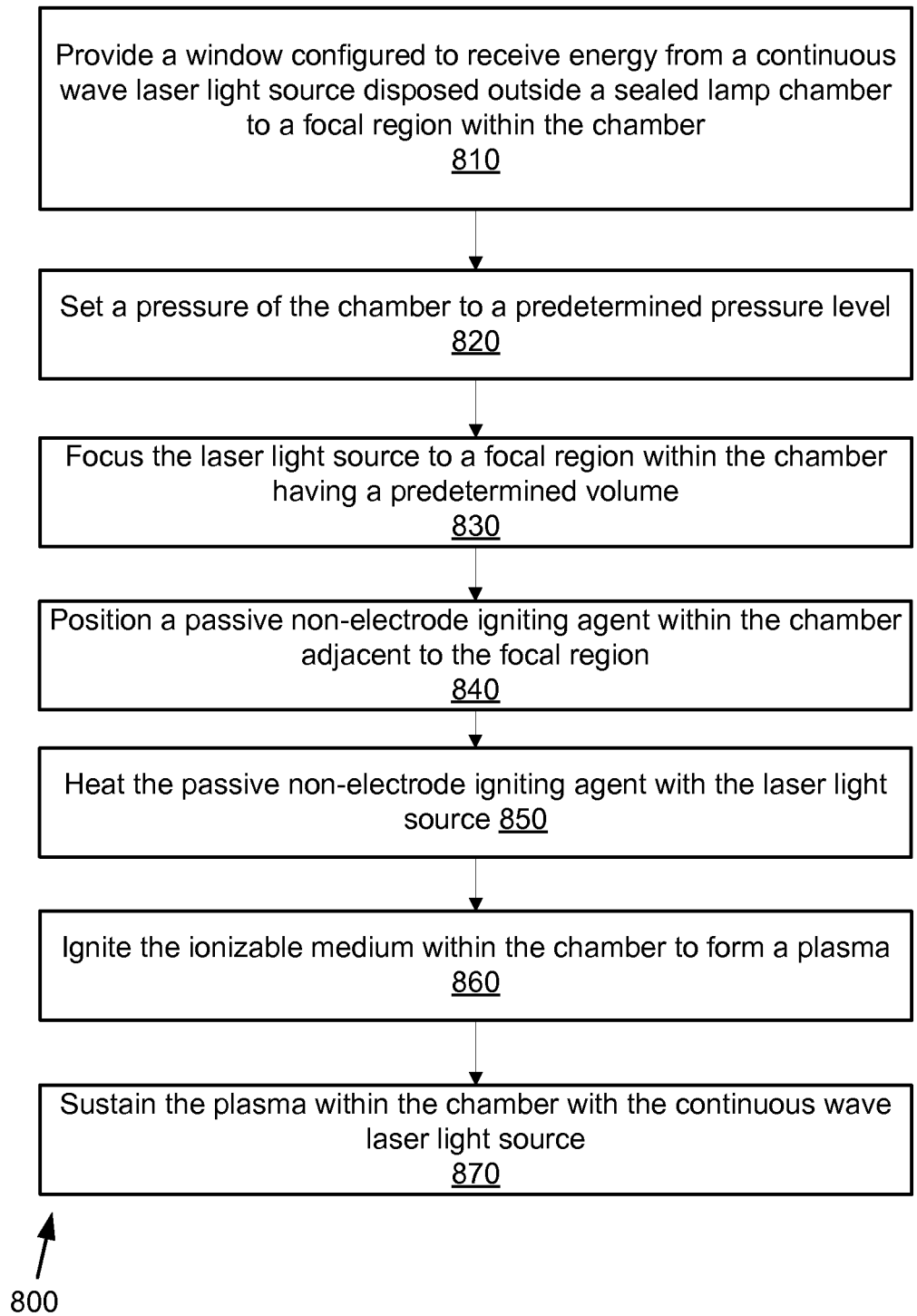
FIG. 8 is a flowchart of a second exemplary method for operating a laser driven electrodeless sealed beam lamp.

FIG. 8 is a flowchart of a second exemplary method for operating a laser driven electrodeless sealed beam lamp. Reference is made to FIGS. 5 and 6 regarding the flowchart in FIG. 8. The window is configured to receive energy from a continuous wave laser light source 360 disposed outside a sealed lamp chamber 320 to a focal region 372 within the chamber 320, as shown by block 810. A pressure level of the chamber 320 is set to a predetermined pressure level appropriate to igniting an ionizable medium within the chamber 320, as shown by block 820. Ingress laser light 365 from the laser light source 360 is focused to a focal region 372 within the chamber 320 having a predetermined volume as shown by block 830, for example a cross sectional FWHM (full width of the beam at half its maximum intensity) beam waist of 1 to 15 micron$^2$ with a Rayleigh length of 6-18 microns.

A passive non-electrode igniting agent 610 disposed entirely within the chamber 320 is positioned adjacent to the focal region 372, as shown by block 840. The passive non-electrode igniting agent 610 may be heated either directly or indirectly. The passive non-electrode igniting agent 610 is heated directly by focusing the laser light onto the thoria and once hot, redirecting the laser into the desired focal point of the lamp cavity. Indirect heating of the thoria occurs through thermal convection of the ionizing gas with the laser light source 360, as shown by block 850. The ionizable medium within the chamber 320 is ignited by the heated passive non-electrode igniting agent 610 to form a plasma, as shown by block 860. For example, if the CW laser light source is in the range of 125-200 Watts, with a pressure level of 300-600 psi may be suitable to ignite the ionizable medium with a passive non-electrode igniting agent 610 heated with energy from the CW laser 360. The plasma within the chamber 320 is sustained with energy from the continuous wave laser light source 360, as shown by block 870.

In summary, it will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. An ignition facilitated electrodeless sealed high intensity illumination device configured to receive a laser beam from a continuous wave (CW) laser light source comprising:
   a sealed chamber configured to contain an ionizable medium, the chamber further comprising:
   an ingress window disposed within a wall of a chamber interior surface configured to admit the CW laser beam into the chamber;
   a plasma sustaining region; and
   a high intensity light egress window configured to emit high intensity light from the chamber,
   wherein a path of the CW laser beam from the CW laser light source through the ingress window to a focal region within the chamber is direct, the ingress window is configured to focus the CW laser beam to a region with a full width at half maximum (FWHM) beam waist of 1-15 microns$^2$ and a Rayleigh length of 6-18 micron or less, and the plasma is configured to be ignited by the CW laser beam without the use of an ignition agent.

2. The sealed high intensity illumination device of claim 1, wherein the ingress window further comprises a lens configured to focus the CW laser beam to a lens focal region within the chamber.

3. The sealed high intensity illumination device of claim 1, wherein the ingress window comprises a flat window.

4. The sealed high intensity illumination device of claim 3, further comprising a lens disposed in the path between the CW laser light source and the ingress window configured to focus the CW laser beam to a lens focal region within the chamber.

5. The sealed high intensity illumination device of claim 1, wherein the sealed chamber comprises a quartz body.

6. The sealed high intensity illumination device of claim 1, an integral reflective chamber interior surface configured to reflect high intensity light from the plasma sustaining region to the egress window.

7. The sealed high intensity illumination device of claim 1, further comprising a viewing window disposed within the wall of the integral reflective chamber interior surface.

8. The sealed high intensity illumination device of claim 7, wherein the viewing window is configured to provide a visual path to the plasma sustaining region from outside the sealed chamber.

9. The sealed high intensity illumination device of claim 1, wherein the reflective interior surface is substantially transparent to the CW laser beam.

10. The sealed high intensity illumination device of claim 1, wherein the chamber is enclosed by a ceramic or metal body CERMAX lamp with integral parabolic or elliptical reflector.

11. The sealed high intensity illumination device of claim 10, further comprising a hyperbolic internal reflector.

12. The sealed high intensity illumination device of claim 1, wherein the chamber is enclosed by a dual window cylindrical Xenon lamp.

13. The sealed high intensity illumination device of claim 1, wherein ionizable medium comprises Xenon gas.

14. The sealed high intensity illumination device of claim 1, further comprising a non-integral convex hyperbolic reflector disposed within the chamber disposed between the plasma sustaining region and the egress window, wherein the non-integral reflector is configured to reflect high intensity light from the plasma sustaining region toward the integral reflective chamber interior surface, wherein the non-integral reflector is configured to reflect non-visible light from the plasma sustaining region to the egress window.

15. A method for operating a sealed beam Xenon lamp without ignition electrodes comprising a sealed chamber, comprising the steps of:
   providing a window configured to receive energy from a continuous wave (CW) laser light source disposed outside the chamber to a focal region within the chamber;
   setting a pressure of the chamber to a predetermined pressure level;
   focusing the CW laser light source to a focal region within the chamber having a predetermined volume of 300 micron$^3$ or less within the chamber;
   igniting the ionizable medium within the chamber with only the CW laser light source to form a plasma without the use of an ignition agent; and
   sustaining the plasma within the chamber with the CW laser light source.

16. The method of claim 15, wherein the predetermined pressure level is at least 300 psi, and the CW laser light source has a power level of at least 200 Watts.

17. The method of claim 15, wherein the predetermined pressure level is in the range of 300-600 psi, and the CW laser light source has a power level in the range of 250-500 Watts.

18. A method for operating a sealed beam Xenon lamp without ignition electrodes comprising a sealed chamber, comprising the steps of:
   providing a window configured to receive energy from a continuous wave (CW) laser light source disposed outside the chamber to a focal region within the chamber;
   setting a pressure of the chamber to a predetermined pressure level;
   positioning a passive non-electrode igniting agent disposed entirely within the chamber adjacent to the focal region;
   heating the passive non-electrode igniting agent with the CW laser light source;
   igniting the ionizable medium within the chamber with the heated passive non-electrode igniting agent to form a plasma;
   focusing the CW laser light source to a focal region within the chamber having a predetermined volume of 300 micron$^3$ or less within the chamber; and
   sustaining the plasma within the chamber with the CW laser light source,
   wherein the passive non-electrode igniting agent does not comprise an electrical connection, the predetermined pressure level is at least 300 psi, and the CW laser light source has a power level of at least 125 Watts.

19. The method of claim 18, wherein the passive non-electrode igniting agent comprises thoriated tungsten.

20. The method of claim 18, wherein the passive non-electrode igniting agent comprises Kr-85.

21. The method of claim 18, wherein the heating of the passive non-electrode igniting agent with the CW laser light source is indirect.

22. The method of claim 18, further comprising the step of focusing the CW laser light source onto the passive non-electrode igniting agent, and wherein the heating of the passive non-electrode igniting agent with the CW laser light source is direct.

* * * * *